United States Patent
Park et al.

(10) Patent No.: US 9,735,313 B2
(45) Date of Patent: Aug. 15, 2017

(54) SEMICONDUCTOR LIGHT EMITTING DEVICE PACKAGE AND METHOD FOR MANUFACTURING THE SAME

(71) Applicant: SAMSUNG ELECTRONICS CO., LTD., Suwon-si (KR)

(72) Inventors: Il Woo Park, Suwon-si (KR); Jung Hoon Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/972,532

(22) Filed: Dec. 17, 2015

(65) Prior Publication Data

US 2016/0197229 A1 Jul. 7, 2016

(30) Foreign Application Priority Data

Jan. 5, 2015 (KR) .................. 10-2015-0000803

(51) Int. Cl.
*H01L 21/00* (2006.01)
*H01L 33/00* (2010.01)
*H01L 33/50* (2010.01)
*H01L 33/20* (2010.01)

(52) U.S. Cl.
CPC .......... *H01L 33/0079* (2013.01); *H01L 33/20* (2013.01); *H01L 33/50* (2013.01)

(58) Field of Classification Search
CPC ..... H01L 2924/12041; H01L 2924/181; H01L 33/50; H01L 33/20; H01L 33/502
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |

(Continued)

FOREIGN PATENT DOCUMENTS

| | | |
|---|---|---|
| JP | 2013-239730 A | 11/2013 |
| KR | 10-1350159 B1 | 2/2014 |

*Primary Examiner* — Zandra Smith
*Assistant Examiner* — John M Parker
(74) *Attorney, Agent, or Firm* — Sughrue Mion, PLLC

(57) ABSTRACT

A method for manufacturing a semiconductor light emitting device package includes forming a light emitting structure including a first conductivity-type semiconductor layer, an active layer, and a second conductivity-type semiconductor layer sequentially stacked on a growth substrate, forming a reflective layer on a first surface of the light emitting structure corresponding to a surface of the second conductivity-type semiconductor layer, forming bumps on the first surface, the bumps being electrically connected to the first or second conductivity-type semiconductor layer and protruding from the reflective layer, bonding a support substrate to the bumps on the first surface, removing the growth substrate, bonding a light transmissive substrate coated with a wavelength conversion layer to a second surface of the light emitting structure from which the growth substrate is removed, and removing the support substrate. The reflective layer covers at least portions of side surfaces of the light emitting structure and the bumps.

20 Claims, 15 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,232,117 B2 | 7/2012 | Basin et al. |
| 8,263,987 B2 | 9/2012 | Choi et al. |
| 8,324,001 B2 | 12/2012 | Kim |
| 8,324,646 B2 | 12/2012 | Lee et al. |
| 8,377,726 B2 | 2/2013 | Kojima et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,729,592 B2 | 5/2014 | Iduka et al. |
| 8,735,931 B2 | 5/2014 | Han et al. |
| 8,766,295 B2 | 7/2014 | Kim |
| 2004/0245530 A1* | 12/2004 | Kameyama ....... H01L 27/14618 257/80 |
| 2008/0173884 A1* | 7/2008 | Chitnis .................... H01L 33/44 257/98 |
| 2008/0179611 A1* | 7/2008 | Chitnis ................. H01L 33/508 257/98 |
| 2011/0215365 A1 | 9/2011 | Lin |
| 2013/0082294 A1 | 4/2013 | Nakayama et al. |
| 2013/0292716 A1 | 11/2013 | Steigerwald |

\* cited by examiner

SEMICONDUCTOR LIGHT EMITTING DEVICE PACKAGE AND METHOD FOR MANUFACTURING THE SAME

CROSS-REFERENCE TO RELATED APPLICATION

This application claims the priority and benefit of Korean Patent Application No. 10-2015-0000803 filed on Jan. 5, 2015, with the Korean Intellectual Property Office, the disclosure of which is incorporated herein by reference.

BACKGROUND

1. Field

Apparatuses and methods consistent with exemplary embodiments relate to a semiconductor light emitting device package and a method for manufacturing the same.

2. Related Art

Light emitting diodes (LEDs) are known as next generation light sources having various advantages such as long lifespans, low power consumption, rapid response speeds, and environmental friendliness. LEDs have emerged as light sources for various products, such as lighting devices and the backlights of display devices. Such LEDs may be provided in the form of packages so as to be easily mounted in various devices.

As the use of LEDs has extended into various fields, the size of LED packages has been reduced to allow for a sufficient degree of freedom in designing of lighting devices for specific purposes. Research has been actively conducted in order to manufacture small LED packages that can be manufactured at low cost using a simplified process, while improving heat dissipation performance and light emitting efficiency.

SUMMARY

One or more exemplary embodiments provide a semiconductor light emitting device package and a method for manufacturing the same that can reduce manufacturing costs through a simplified process while securing improved light emitting performance and reliability.

According to an aspect of an exemplary embodiment, a method for manufacturing a semiconductor light emitting device package may include forming a light emitting structure including a first conductivity-type semiconductor layer, an active layer, and a second conductivity-type semiconductor layer which are sequentially stacked on a growth substrate, forming a reflective layer on a first surface of the light emitting structure corresponding to a surface of the second conductivity-type semiconductor layer, forming bumps on the first surface of the light emitting structure, the bumps being electrically connected to the first or second conductivity-type semiconductor layer and protruding from the reflective layer, bonding a support substrate to the bumps on the first surface of the light emitting structure; removing the growth substrate, bonding a light transmissive substrate coated with a wavelength conversion layer to a second surface of the light emitting structure from which the growth substrate is removed, and removing the support substrate, wherein the reflective layer may cover at least a portion of side surfaces of the light emitting structure and at least a portion of side surfaces of the bumps.

The side surfaces of the light emitting structure may be covered by the reflective layer and the wavelength conversion layer.

At least one of the side surfaces of the light emitting structure may include at least two inclined surfaces having different inclinations.

A boundary between the two inclined surfaces may correspond to a boundary between the reflective layer and the wavelength conversion layer.

The wavelength conversion layer may be formed on a surface of the light transmissive substrate facing the first conductivity-type semiconductor layer.

The forming of the reflective layer may include forming a mask layer, covering regions in which the bumps are to be formed and isolation regions in which the light emitting structure is cut into package units, on the first surface of the light emitting structure, forming a material layer for forming the reflective layer to cover portions of the light emitting structure exposed through the mask layer, removing a portion of the material layer for forming the reflective layer using a planarization method to expose a top surface of the mask layer, and removing the mask layer.

The bumps may protrude from a top surface of the reflective layer.

The method may further include, prior to forming the reflective layer: mesa-etching the light emitting structure to expose a portion of the first conductivity-type semiconductor layer; and forming electrodes and bump pads on the first surface of the light emitting structure.

The support substrate may be bonded to the bumps on the first surface of the light emitting structure using an adhesive layer.

The method may further include forming uneven portions on the second surface of the light emitting structure after removing the growth substrate.

The method may further include removing a portion of the light emitting structure and dividing the light emitting structure into package units, after removing the growth substrate.

The method may further include cutting the light transmissive substrate and the wavelength conversion layer into package units, after removing the support substrate.

A plurality of semiconductor light emitting device packages may be manufactured on a wafer level, and the wavelength conversion layer may be bonded to the light emitting structure on the wafer level.

The wavelength conversion layer may have a thickness variation of 1 μm to 3 μm among the plurality of packages manufactured on the wafer level.

According to an aspect of another exemplary embodiment, a method for manufacturing a semiconductor light emitting device package may include forming a light emitting structure including a first conductivity-type semiconductor layer, an active layer, and a second conductivity-type semiconductor layer which are sequentially stacked on a growth substrate, forming a reflective layer on a first surface of the light emitting structure corresponding to a surface of the second conductivity-type semiconductor layer, forming bumps on the first surface of the light emitting structure, the bumps being electrically connected to the first or second conductivity-type semiconductor layer, surrounded by the reflective layer and protruding from the reflective layer, bonding a support substrate to the bumps on the first surface of the light emitting structure, removing the growth substrate, removing a portion of the light emitting structure and dividing the light emitting structure into package units, bonding a light transmissive substrate coated with a wavelength conversion layer to a second surface of the light emitting structure from which the growth substrate is removed, and removing the support substrate, wherein side surfaces of the light emitting structure may be covered by the reflective layer and the wavelength conversion layer.

The method may further include mesa-etching the light emitting structure to expose a portion of the first conductivity-type semiconductor layer prior to forming the reflective layer, wherein the mesa-etching of the light emitting structure may create a first side surface of the light emitting structure.

The dividing of the light emitting structure may create a second side surface of the light emitting structure, and the first and second side surfaces may have different inclinations.

The wavelength conversion layer may cover the second side surface of the light emitting structure.

The reflective layer may cover the first side surface of the light emitting structure.

The reflective layer may contact the wavelength conversion layer on at least one of the side surfaces of the light emitting structure.

According to an aspect of another exemplary embodiment, a semiconductor light emitting device package may include: a light emitting structure including a first conductivity-type semiconductor layer, an active layer, and a second conductivity-type semiconductor layer; bumps disposed on a first surface of the light emitting structure and electrically connected to the first or second conductivity-type semiconductor layer; a reflective layer disposed on the first surface of the light emitting structure and covering at least a portion of side surfaces of the light emitting structure and at least a portion of side surfaces of the bumps; and a wavelength conversion layer disposed on a second surface of the light emitting structure opposite the first surface of the light emitting structure.

The semiconductor light emitting device package may further include a light transmissive substrate disposed on the wavelength conversion layer.

The side surfaces of the light emitting structure may be covered by the reflective layer and the wavelength conversion layer.

At least one of the side surfaces of the light emitting structure may include at least two inclined surfaces having different inclinations.

A boundary between the two inclined surfaces may correspond to a boundary between the reflective layer and the wavelength conversion layer.

According to an aspect of another exemplary embodiment, a semiconductor light emitting device package is provided. The semiconductor light emitting device package includes: a light emitting structure; a plurality of bumps disposed on a first surface of the light emitting structure and electrically connected to the light emitting structure; a reflective layer disposed on the first surface of the light emitting structure and covering at least a portion of side surfaces of the light emitting structure; and a wavelength conversion layer disposed on a second surface of the light emitting structure opposite the first surface of the light emitting structure.

The semiconductor light emitting device package may further include a lens disposed on the wavelength conversion layer.

BRIEF DESCRIPTION OF DRAWINGS

The above and other aspects, features and advantages of the exemplary embodiments will be more clearly understood from the following detailed description taken in conjunction with the accompanying drawings, in which.

DETAILED DESCRIPTION

Figure 1:
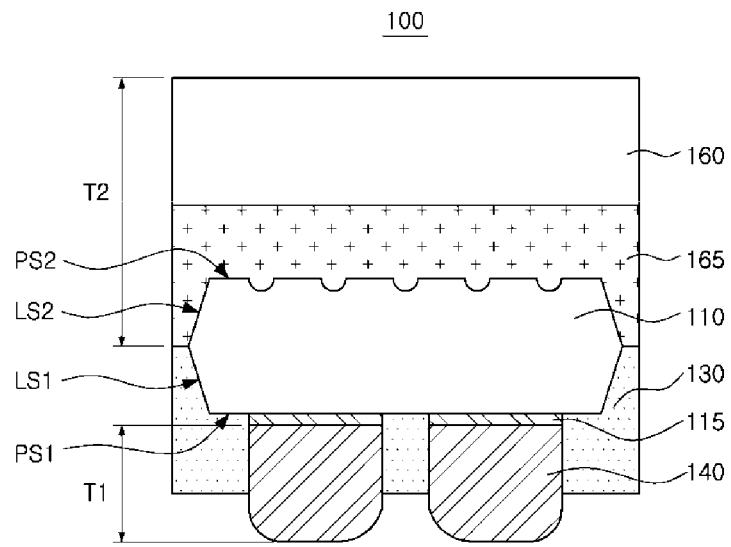
FIG. 1 is a cross-sectional view illustrating a semiconductor light emitting device package according to an exemplary embodiment.

Exemplary embodiments of the present inventive concept will now be described in detail with reference to the accompanying drawings.

The inventive concept may, however, be exemplified in many different forms and should not be construed as being limited to the specific exemplary embodiments set forth herein. Rather, these exemplary embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

Throughout the specification, unless otherwise defined, terms such as "top portion" or "upper portion," "top surface," "bottom portion" or "lower portion," "bottom surface," "side surface," and the like, are defined on the basis of the directionality of the drawings, which may be changed according to a direction in which a device or a package is actually mounted.

FIG. 1 is a cross-sectional view illustrating a semiconductor light emitting device package according to an exemplary embodiment.

Referring to FIG. 1, a semiconductor light emitting device package 100 according to the exemplary embodiment may include a light emitting structure 110 having first and second surfaces PS1 and PS2, bump pads 115 disposed on the first surface PS1, a reflective layer 130, bumps 140, a wavelength conversion layer 165 disposed on a second surface PS2 and a light transmissive substrate 160.

The semiconductor light emitting device package 100 according to the present exemplary embodiment may be a chip scale package (CSP) and a wafer level package (WLP).

Figure 16:
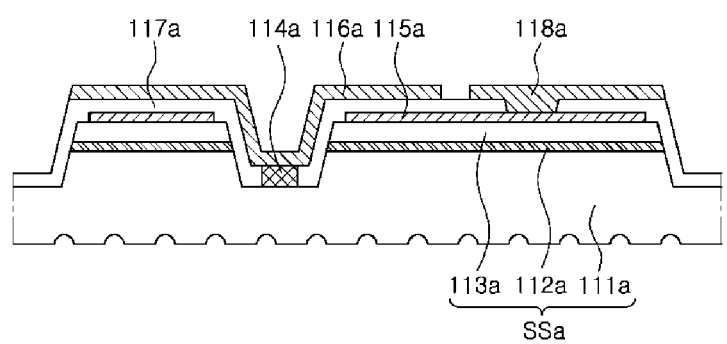
FIGS. 16 through 18 are cross-sectional views illustrating examples of a light emitting structure provided in a semiconductor light emitting device package according to an exemplary embodiment.
Figure 17:
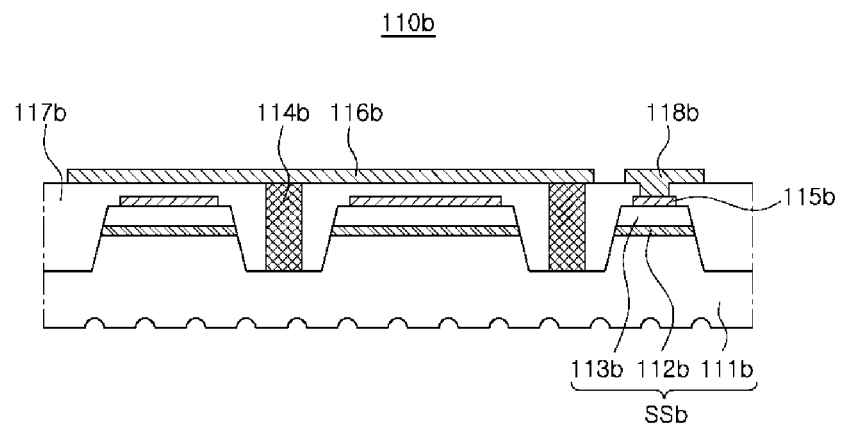
Figure 18:
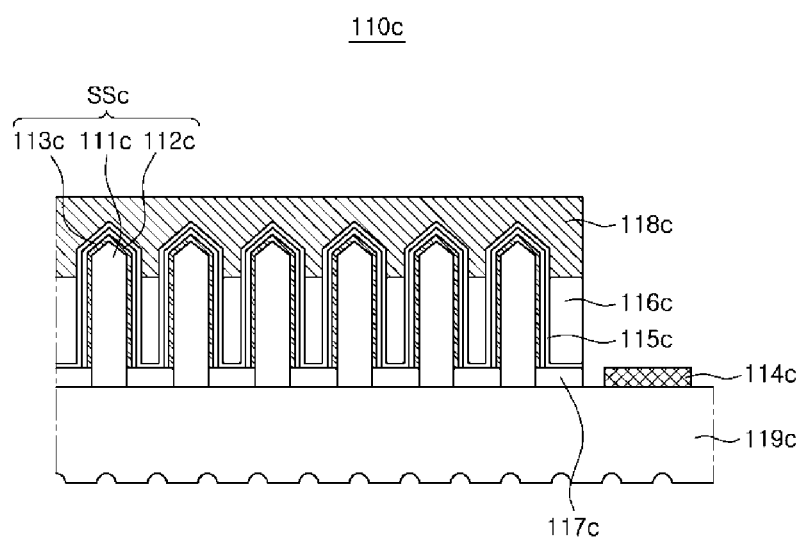

The light emitting structure 110 may include a first conductivity-type semiconductor layer, an active layer, a second conductivity-type semiconductor layer and electrodes, and details thereof will be provided with reference to FIGS. 16 through 18.

The light emitting structure 110 may have first and second side surfaces LS1 and LS2 having different inclinations. The inclinations may be formed to allow a cross-sectional area of the light emitting structure 110 to be reduced in a thickness direction of the light emitting structure 110 from a central portion of the light emitting structure 110 toward top and bottom portions of the light emitting structure 110. That is, an area of the first surface PS1 (a bottom surface) or the second surface PS2 (a top surface) of the light emitting structure 110 in the thickness direction thereof may be smaller than a cross-sectional area of the central portion of the light emitting structure 110 taken in a direction perpendicular to the thickness direction. Therefore, the light emitting structure 110 may be a polyhedral body having more than six surfaces. For example, the light emitting structure 110 may have ten surfaces.

The second surface PS2 of the light emitting structure 110 may be a light emitting surface through which light generated in the light emitting structure 110 is emitted. Therefore, uneven portions may be formed on the second surface PS2 in order to improve light extraction efficiency.

The bump pads 115 may be disposed on the first surface PS1 of the light emitting structure 110. The bump pads 115 may be electrically connected to the electrodes of the light emitting structure 110. The bumps 140 may be disposed on the bump pads 115 to be electrically connected thereto, and may protrude from the reflective layer 130.

The bump pads 115 and the bumps 140 may be formed of a conductive material. For example, the bump pads 115 and the bumps 140 may include at least one of copper (Cu), aluminum (Al), silver (Ag), tin (Sn), or gold (Au).

The number and shape of the bump pads 115 and the bumps 140 are not limited to those illustrated in the drawings, and may be varied according to the size of the light emitting structure 110, the electrode structure provided therein, and the like.

The reflective layer 130 may be disposed to cover the first surface PS1 and the first side surface LS1 of the light emitting structure 110. The reflective layer 130 may be disposed to cover portions of side surfaces of the bumps 140. Since the reflective layer 130 is disposed to cover the first side surface LS1 of the light emitting structure 110 as well as the first surface PS1, it may reflect light extracted from the side surface of the light emitting structure 110 to thereby improve light extraction efficiency. A thickness of the reflective layer 130 covering the portions of the side surfaces of the bumps 140 may be varied according to exemplary embodiments.

The reflective layer 130 may include a reflective material, and may include a metal oxide having excellent reflectivity such as $TiO_2$ or $Al_2O_3$. For example, the reflective layer 130 may be formed by using a material containing $TiO_2$ or $Al_2O_3$ having high light reflectivity in a high polymer such as silicone resin, and may be formed of a material having high heat resistance and high light stability.

The light transmissive substrate 160 may be formed of a transparent material, and may be formed of a light-transmissive insulating material. The light transmissive substrate 160 may be formed of at least one of glass, quartz, transparent resin, $SiO_2$, SiN, $Al_2O_3$, HfO, $TiO_2$ or ZrO.

The wavelength conversion layer 165 may be disposed on one surface of the light transmissive substrate 160, and may be disposed to cover the second surface PS2 and the second side surface LS2 of the light emitting structure 110. An area of the wavelength conversion layer 165 is larger than that of the light emitting structure 110, whereby luminance may be improved. In addition, since the light emitting structure 110 has the inclined side surfaces LS1 and LS2, a contact area between the light emitting structure 110 and the wavelength conversion layer 165 is increased, whereby defects such as delamination of the wavelength conversion layer 165 may be prevented.

The wavelength conversion layer 165 may include a phosphor which is excited by the light emitted by the light emitting structure 110 to produce light having a wavelength different from that of the light emitted by the light emitting structure 110. By combining the light emitted by the phosphor and the light emitted by the light emitting structure 110, light of a desired color such as white light may be created. In exemplary embodiments, the wavelength conversion layer 165 may include a quantum dot. Alternatively, the wavelength conversion layer 165 may include both a phosphor and a quantum dot, or may only include a quantum dot.

The bump 140 has a first thickness T1, while the light transmissive substrate 160 and the wavelength conversion layer 165 have a second thickness T2. For example, the first thickness T1 may range from 50 μm to 120 μm. For example, the second thickness T2 may range 40 μm to 120 μm. The first and second thicknesses T1 and T2 may be adjusted relative to each other so as to stably support the light emitting structure 110 during manufacturing the semiconductor light emitting device package 100. For example, in a case in which the first thickness T1 is relatively small, the second thickness T2 may be adjusted to be relatively large. In addition, the first and second thicknesses T1 and T2 may be selected to be appropriate for the miniaturization of the semiconductor light emitting device package 100 while being sufficient to stably support the light emitting structure 110.

In the case of the semiconductor light emitting device package 100 according to the present exemplary embodiment, the bumps 140 may be directly mounted on an external device such as a light emitting module, whereby the manufacturing process may be simplified and manufacturing costs may be reduced. In addition, heat generated in the light emitting structure 110 may be effectively dissipated by the bumps 140 externally.

FIGS. 2 through 12 are views illustrating a method for manufacturing a semiconductor light emitting device package according to an exemplary embodiment.

Figure 2:
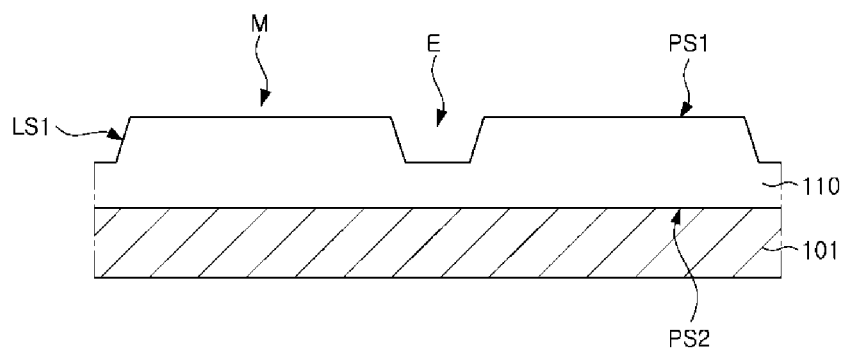
FIGS. 2 through 12 are views illustrating a method for manufacturing a semiconductor light emitting device package according to an exemplary embodiment.

Referring to FIG. 2, a plurality of semiconductor layers may be grown on the substrate 101 to form the light emitting structure 110 including a first conductivity-type semiconductor layer, an active layer and a second conductivity-type semiconductor layer. Next, the light emitting structure 110 may be etched to form mesa regions M and etched regions E. The first conductivity-type semiconductor layer disposed below the etched regions E may be exposed through the etched regions E.

As illustrated in FIG. 1, a surface of the second conductivity-type semiconductor layer, which is the top surface of the light emitting structure 110, is referred to as the first surface PS1, the bottom surface of the light emitting structure 110 in contact with the substrate 101 is referred to as the second surface PS2.

The light emitting structure 110 may be formed using metal organic chemical vapor deposition (MOCVD), hydride vapor phase epitaxy (HVPE), molecular beam epitaxy (MBE) or the like.

For example, the substrate 101 may be a growth substrate having a wafer form. The plurality of light emitting structures 110 may be simultaneously formed to manufacture a plurality of semiconductor light emitting devices. The substrate 101 may be made of an insulating, conductive or semiconductor material, such as sapphire, SiC, $MgAl_2O_4$, MgO, $LiAlO_2$, $LiGaO_2$, or GaN. In a case of the substrate 101 made of sapphire, a crystal having Hexa-Rhombo R3C symmetry, the sapphire substrate has a lattice constant of 13.001 Å on a C-axis and a lattice constant of 4.758 Å on an A-axis and includes a C (0001) plane, an A (11-20) plane, an R (1-102) plane, and the like. The C plane is mainly used as a substrate for nitride semiconductor growth because it facilitates growth of a nitride film and is stable at high temperatures. Meanwhile, in a case in which the substrate 101 is made of Si, the Si substrate may be easily formed to have a large diameter and may be relatively cheap, whereby manufacturing yields may be improved.

In exemplary embodiments, a buffer layer may be further disposed on the substrate 101 in order to improve crystallinity of the light emitting structure 110. For example, the buffer layer may be made of $Al_xGa_{1-x}N$ which is grown at low temperatures without doping.

Although two adjacent semiconductor light emitting device packages are illustrated, the manufacturing process may be performed on a wafer level. FIG. 2 illustrates regions corresponding to two semiconductor light emitting device packages which are disposed to be adjacent to each other on the basis of a central etched region E. However, the etched region E may not only be disposed at an edge of a region for a single semiconductor light emitting device package, but may also be disposed between the mesa regions M within a region for a single semiconductor light emitting device package.

Figure 3:
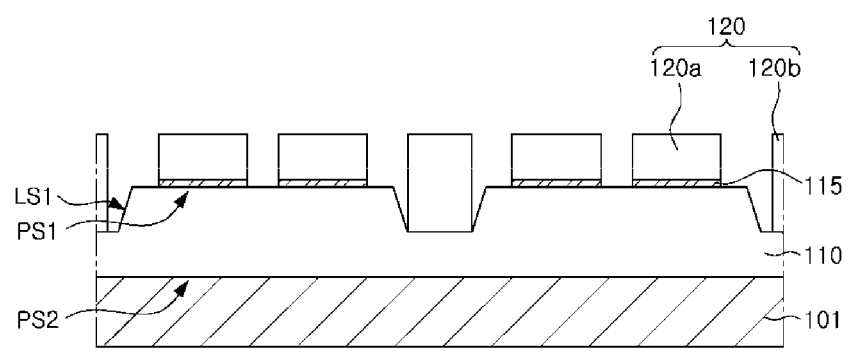

Referring to FIG. 3, a conductive material may be deposited on the first surface PS1 of the light emitting structure 110 to form the bump pads 115, and mask layers 120 may be formed thereon. The mask layers 120 may include a first mask layer 120a covering a region on which the bump 140 (see FIG. 1) is to be formed, and a second mask layer 120b covering an isolation region for isolating the light emitting structures 110 from each other, in which the light emitting structure is cut into package units.

The bump pad 115 may be formed to have a single layer structure or a multilayer structure including different materials. For example, the bump pads 115 may include at least one of copper (Cu), nickel (Ni), aluminum (Al), silver (Ag), tin (Sn), or gold (Au). For example, the mask layer 120 may be a photoresist layer.

Figure 4:
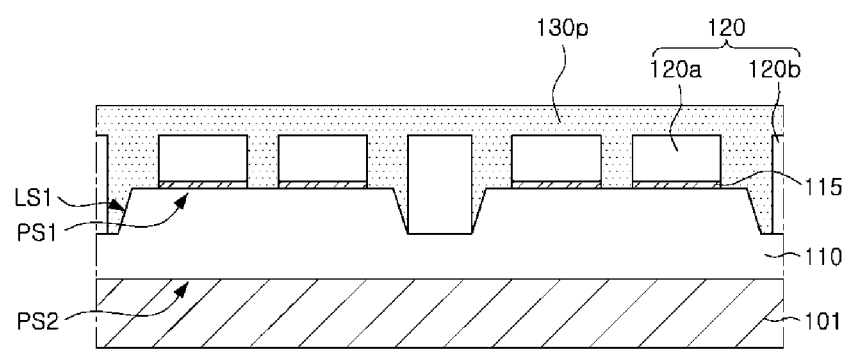

Referring to FIG. 4, a preliminary reflective layer 130p may be formed to cover the first surface PS1 of the light emitting structure 110 and the mask layers 120.

The preliminary reflective layer 130p may be formed to cover top surfaces of the mask layers 120 while filling spaces between the mask layers 120.

Figure 5:
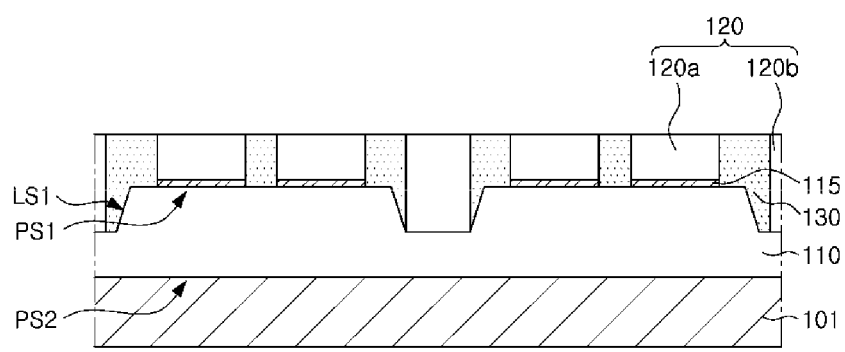

The preliminary reflective layer 130p may be a layer for forming the reflective layer 130 in a subsequent procedure illustrated in FIG. 5. The preliminary reflective layer 130p may include a reflective material, and may include a metal oxide having high reflectivity such as $TiO_2$ or $Al_2O_3$.

Referring to FIG. 5, planarization may be performed to expose the top surfaces of the mask layers 120.

The planarization may be performed through chemical mechanical polishing (CMP). At this time, the reflective layer 130 may be formed between the mask layers 120.

Figure 6:
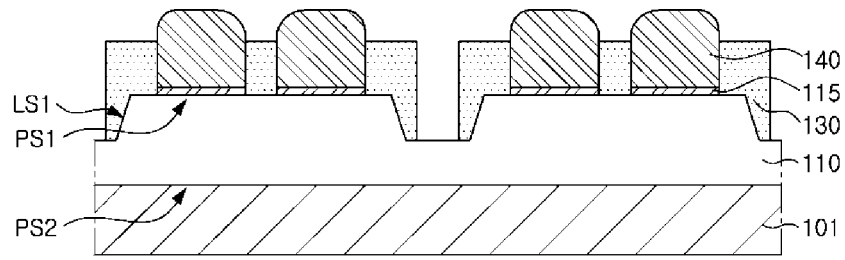

Referring to FIG. 6, the mask layers 120 may be removed. The bumps 140 may be formed on the bump pads 115 in a region from which the first mask layer 120a has been removed.

The bumps 140 may be formed to be higher than a top surface of the reflective layer 130 so as to protrude from the reflective layer 130. The bumps 140 may be conductive adhesive members for allowing the manufactured semiconductor light emitting devices to be mounted on a package substrate or a module substrate by using a flip-chip bonding method. For example, the bumps 140 may be solder bumps, and a small amount of Ag, Ni or Cu may be contained in such solder bumps.

The bumps 140 may be formed on the bump pads 115 through various methods, such as electroplating, solder printing or ball dropping, and a reflow operation may be additionally performed.

In the aforementioned processes, the reflective layer 130 may be formed and then the bumps 140 may be formed. However, this is merely exemplary, and the present inventive concept is not limited thereto. For example, in exemplary embodiments, after the bumps 140 are formed, the reflective layer 130 may be formed. In this case, instead of the processes illustrated in FIGS. 3 through 5, mask layers exposing the bump pads 115 may be used to form the bumps 140 on the first surface PS1 of the light emitting structure 110. Then, the reflective layer 130 may be formed to cover the portions of the side surfaces of the bumps 140 and the first side surface LS1 of the light emitting structure 110.

Figure 7:
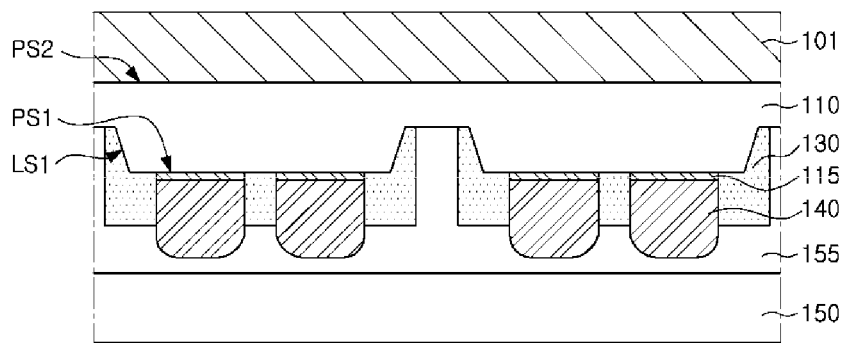

Referring to FIG. 7, a support substrate 150 may be bonded to the bumps 140 on the first surface PS1 of the light emitting structure 110 using an adhesive layer 155.

The support substrate 150 may be temporarily used, and may be formed of an insulating material or a conductive material including any one of Au, Ni, Al, Cu, W, Si, Se, or GaAs. The material for the support substrate 150 is not limited thereto.

The support substrate 150 may be bonded using the adhesive layer 155. For example, the adhesive layer 155 may include epoxy resin or silicone, inorganic polymer. In exemplary embodiments, the adhesive layer 155 may include a silane-based material as an additive for improving adhesive strength.

In a case in which the support substrate 150 is formed of an oxide, the adhesive layer 155 may also be formed of an oxide. The support substrate 150 may be bonded through oxide-oxide bonding.

Figure 8:
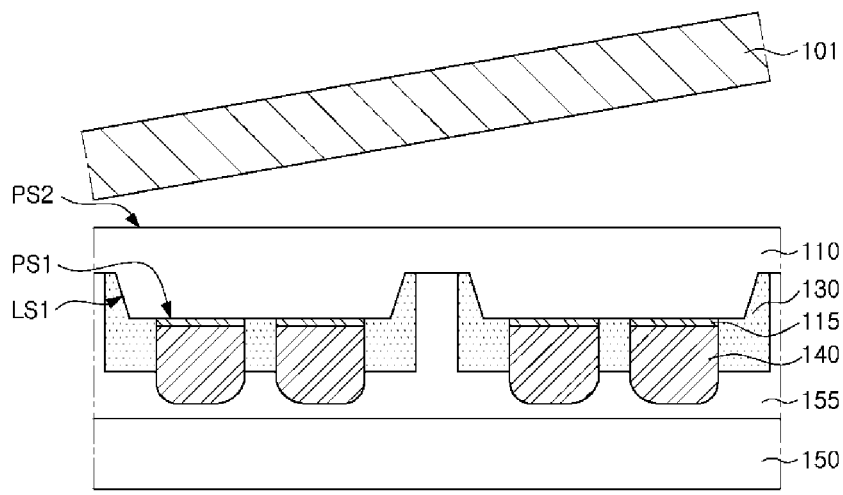

Referring to FIG. 8, the substrate 101 may be removed from the second surface PS2 of the light emitting structure 110.

In order to remove the substrate 101, wet etching, dry etching or a laser lift-off (LLO) technique may be used. In addition, in exemplary embodiments, a mechanical polishing method may also be used.

Since the support substrate 150 is bonded to the bumps 140 on the first surface PS1 of the light emitting structure 110, even after the substrate 101 is removed, the relatively thin light emitting structure 110 may be easily handled during subsequent procedures.

Figure 9:
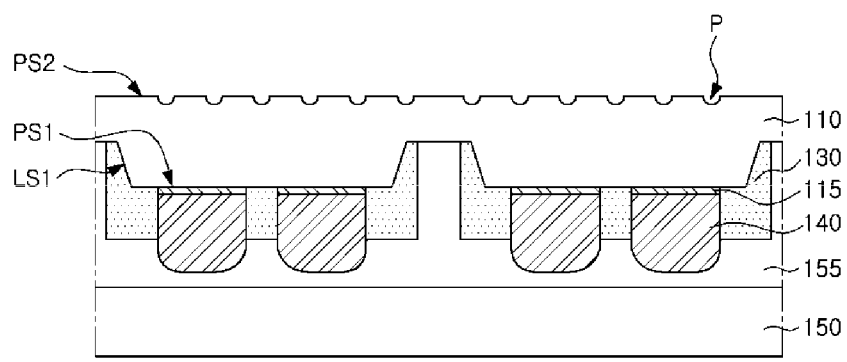

Referring to FIG. 9, uneven portions P may be formed in the second surface PS2 of the light emitting structure 110.

Since light is emitted through the second surface PS2 of the light emitting structure 110, light extraction efficiency may be improved by forming the uneven portions P in the surface of the light emitting structure 110. The shape of the uneven portions is not limited to that illustrated in FIG. 9.

Figure 10:
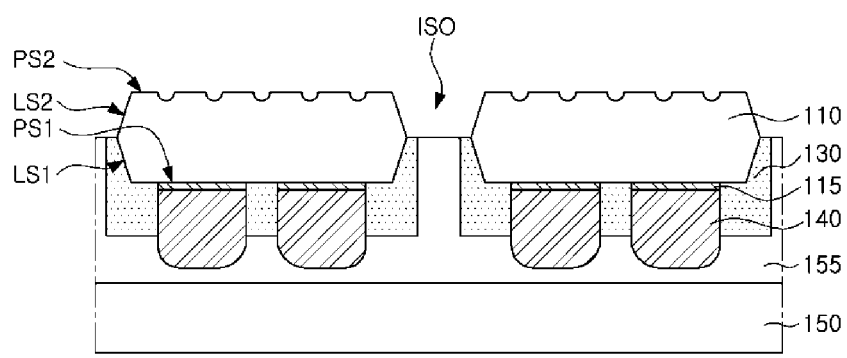

Referring to FIG. 10, a portion of the light emitting structure 110 may be removed to divide the light emitting structure 110 into package units.

Etching may be performed on the second surface PS2 of the light emitting structure 110 so as to divide the light emitting structure 110 into package units. An isolation region (ISO) may be formed between adjacent light emitting structures 110, and the adhesive layer 155 may be exposed through the isolation region (ISO).

At this time, the second side surfaces LS2 of the light emitting structures 110 which are cut may have a predetermined inclination. In addition, the inclination of the second side surfaces LS2 may be different from that of the first side surfaces LS1. Therefore, the light emitting structures 110 may have more than four side surfaces. For example, the light emitting structures 110 may have eight side surfaces.

Figure 11A:
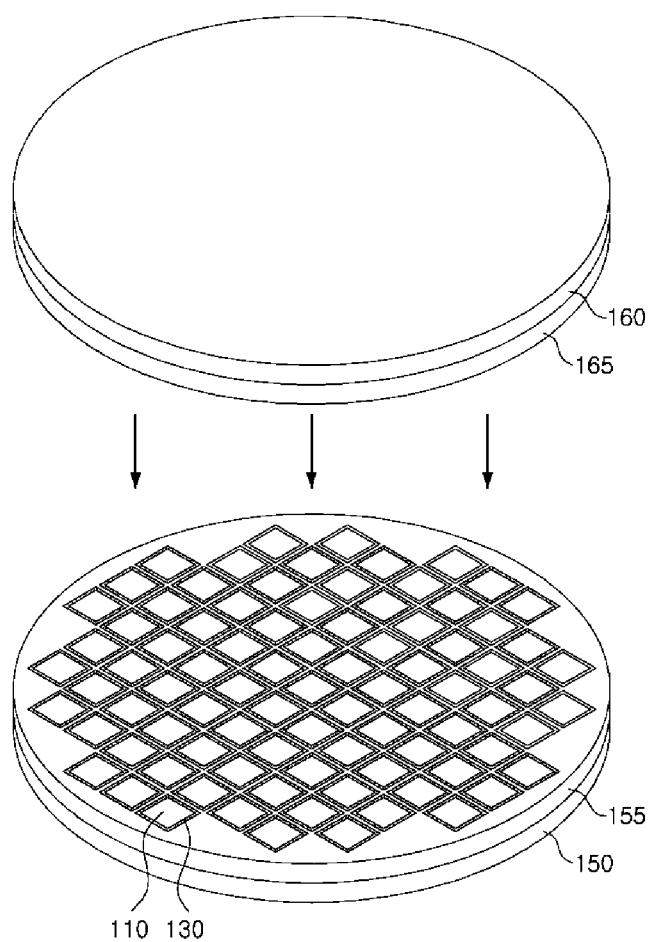
Figure 11B:
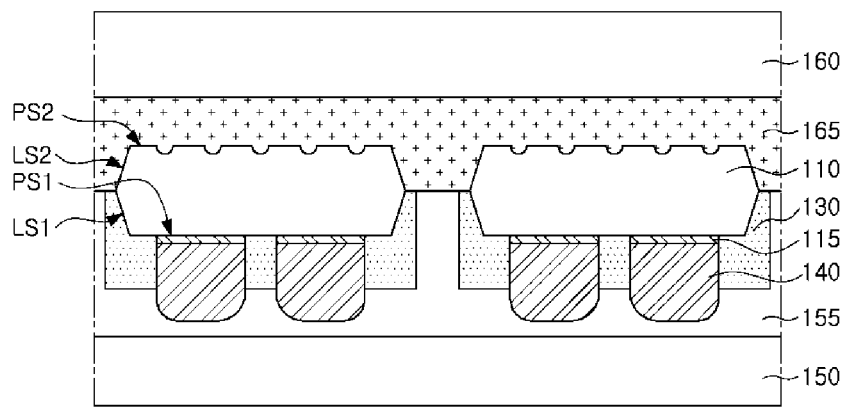

Referring to FIGS. 11A and 11B, the light transmissive substrate 160 coated with the wavelength conversion layer 165 may be prepared, and may be bonded to the second surfaces PS2 of the light emitting structures 110.

For example, the wavelength conversion layer 165 may be formed on the light transmissive substrate 160 by spray coating or spin coating. Alternatively, the wavelength conversion layer 165 may be formed by attaching a phosphor film or a ceramic phosphor sheet to the light transmissive substrate 160.

The wavelength conversion layer 165 may be formed of an adhesive material, and thus may be attached to the light emitting structures 110. Therefore, the shape of the wavelength conversion layer 165 may be changed according to the shapes of the second surfaces PS2 of the light emitting structures 110, the reflective layers 130 and the adhesive layer 155, so as to be attached thereto. The wavelength conversion layer 165 may be formed to cover the second side surfaces LS2 of the light emitting structures 110, and may be in contact with the adhesive layer 155 and the reflective layers 130 in the isolation region (ISO) (see FIG. 10).

According to the present exemplary embodiment, the wavelength conversion layer 165 may be easily formed by the attachment of the light transmissive substrate 160, and may have a uniform thickness between the plurality of semiconductor light emitting device packages. For example, the wavelength conversion layer 165 may have a thickness variation of 1 μm to 3 μm. Therefore, the manufactured semiconductor light emitting device packages may have uniform light emission.

Figure 12:
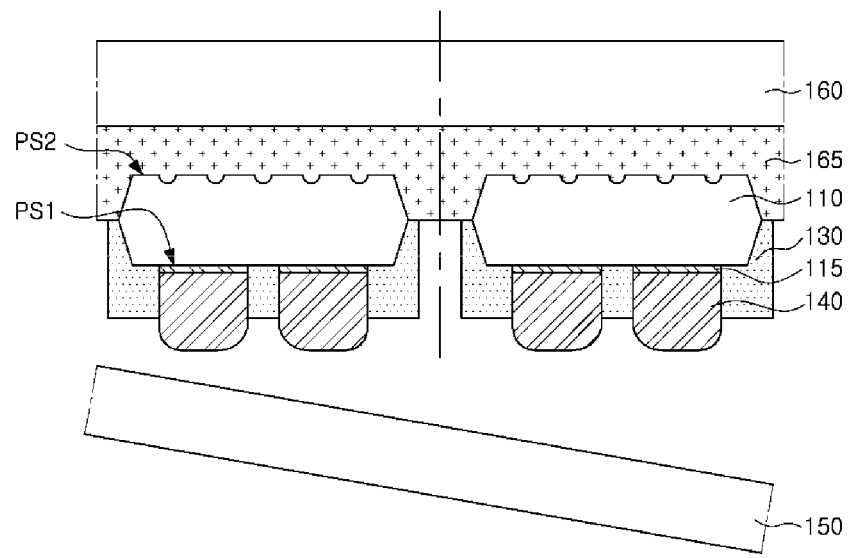

Referring to FIG. 12, the support substrate 150 may be removed.

In a case in which the support substrate 150 is formed of a transparent material, it may be removed using the LLO technique. In a case in which the support substrate 150 is formed of a non-transparent material, it may be removed using mechanical polishing, wet etching or dry etching.

Since the light transmissive substrate 160 is bonded to the second surfaces PS2 of the light emitting structures 110, even after the support substrate 150 is removed, subsequent procedures may be performed without damaging to the light emitting structures 110.

Then, the light emitting structures 110 may be divided into semiconductor light emitting device units by cutting the light transmissive substrate 160 and the wavelength conversion layer 165 into package units.

In this manner, the semiconductor light emitting device package 100 illustrated in FIG. 1 may be finally manufactured. According to the present exemplary embodiment, there is no separate package substrate below the light emitting structure 110, the heat dissipation of the semiconductor light emitting device package 100 may be improved.

Figure 13:
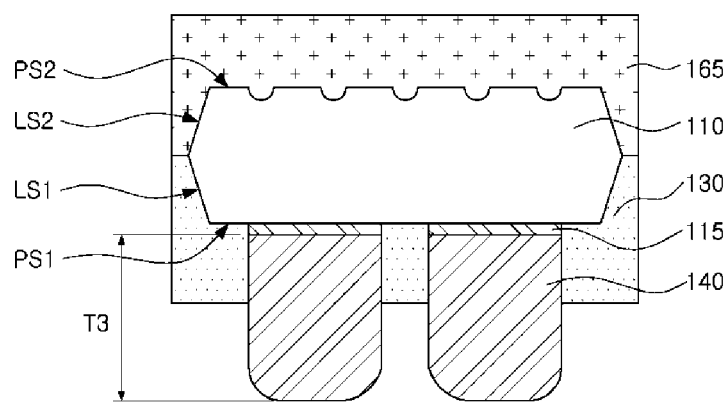
FIG. 13 is a cross-sectional view illustrating a semiconductor light emitting device package according to an exemplary embodiment.

FIG. 13 is a cross-sectional view illustrating a semiconductor light emitting device package according to an exemplary embodiment.

Referring to FIG. 13, a semiconductor light emitting device package 100*a* according to the exemplary embodiment may include the light emitting structure 110 having the first and second surfaces PS1 and PS2, the bump pads 115 disposed on the first surface PS1, the reflective layer 130, the bumps 140 and the wavelength conversion layer 165 disposed on the second surface PS2.

The semiconductor light emitting device package 100*a* according to the present exemplary embodiment may not include the light transmissive substrate 160 on the wavelength conversion layer 165, unlike the exemplary embodiment illustrated in FIG. 1. For example, such a structure of the package may be formed by attaching the tape-type wavelength conversion layer 165 to the light emitting structures 110 in the procedures illustrated in FIGS. 11A and 11B.

In addition, the bump 140 according to the present exemplary embodiment may have a third thickness T3 which is larger than the first thickness of the bump 140 in the semiconductor light emitting device package 100 illustrated in FIG. 1. The light emitting structure 110 may be supported by the relatively thick bumps 140 even without the light transmissive substrate 160, the manufacturing of the semiconductor light emitting device package 100*a* may be facilitated.

Figure 14:
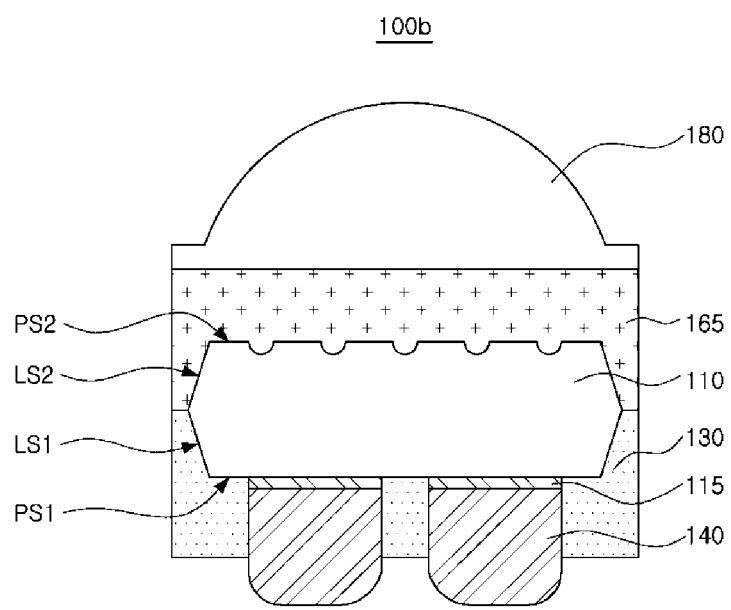
FIG. 14 is a cross-sectional view illustrating a semiconductor light emitting device package according to an exemplary embodiment.

FIG. 14 is a cross-sectional view illustrating a semiconductor light emitting device package according to an exemplary embodiment of the present inventive concept.

Referring to FIG. 14, a semiconductor light emitting device package 100*b* according to the exemplary embodiment may include the light emitting structure 110 having the first and second surfaces PS1 and PS2, the bump pads 115 disposed on the first surface PS1, the reflective layer 130, the bumps 140, the wavelength conversion layer 165 disposed on the second surface PS2 and a lens part 180.

The semiconductor light emitting device package 100*b* according to the present exemplary embodiment may further include the lens part 180 disposed on the wavelength conversion layer 165, unlike the exemplary embodiments illustrated in FIGS. 1 and 13.

The lens part 180 may be able to adjust the angle of light emitted through a top convex surface thereof. As illustrated, the top surface of the lens part 180 may have a dome shape, but the shape thereof is not limited thereto. In exemplary embodiments, the lens part 180 may have an aspherical and/or asymmetrical shape. In addition, the lens part 180 may include a light collecting portion having a Fresnel structure in order to improve linearity of light in a camera flash or the like, and may further include uneven portions on the top surface thereof.

The lens part 180 may be formed of resin having high transparency allowing the light emitted by the light emitting structure 110 to pass therethrough with significantly reduced loss of light. For example, elastic resin, silicone resin, epoxy resin or plastic may be used therefor. The lens part 180 may include colloid particles so as to improve light diffusion.

The lens part 180 may be formed on the wavelength conversion layer 165 from which the light transmissive substrate 160 has been removed, prior to dividing the light emitting structures 110 into package units, in the procedure illustrated in FIG. 12. The lens parts 180 may be attached to the light emitting structures on a wafer level, or may be formed to have a predetermined shape on the top surface of the wavelength conversion layer 165 and be hardened. In exemplary embodiments, the light transmissive substrate 160 (see FIG. 1) may be further disposed between the wavelength conversion layer 165 and the lens part 180.

Figure 15:
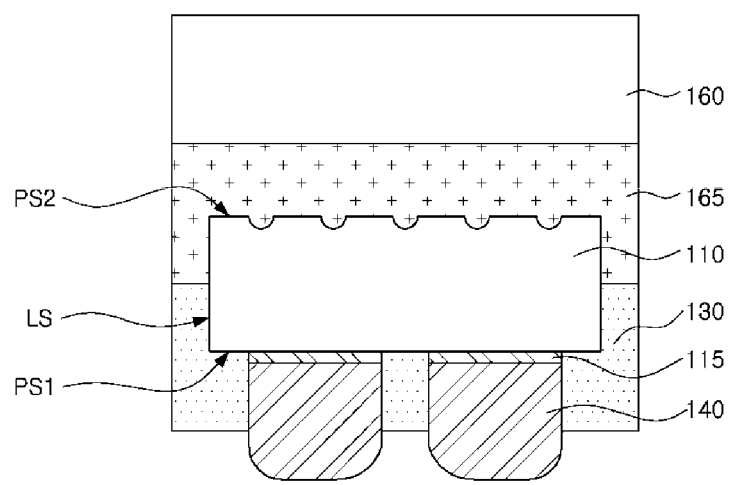
FIG. 15 is a cross-sectional view illustrating a semiconductor light emitting device package according to an exemplary embodiment.

FIG. 15 is a cross-sectional view illustrating a semiconductor light emitting device package according to an exemplary embodiment.

Referring to FIG. 15, a semiconductor light emitting device package 100c according to the exemplary embodiment may include the light emitting structure 110 having the first and second surfaces PS1 and PS2, the bump pads 115 disposed on the first surface PS1, the reflective layer 130, the bumps 140, the wavelength conversion layer 165 disposed on the second surface PS2 and the light transmissive substrate 160.

In the semiconductor light emitting device package 100c according to the present exemplary embodiment, side surfaces LS of the light emitting structure 110 may be perpendicular to the top and bottom surfaces of the light emitting structure 110, unlike the exemplary embodiments illustrated in FIGS. 1, 13 and 14. Since the side surfaces LS of the light emitting structure 110 are covered by the reflective layer 130 and the wavelength conversion layer 165, the loss of light emitted through the side surfaces may be minimized.

The light emitting structure 110 may be vertically etched in the procedures illustrated in FIGS. 2 and 10, thereby having the side surfaces LS.

FIGS. 16 through 18 are cross-sectional views illustrating examples of a light emitting structure provided in a semiconductor light emitting device package according to an exemplary embodiment.

Light emitting structures 110a, 110b, and 110c illustrated in FIGS. 16 through 18 may be employed as the light emitting structures 110 provided in the semiconductor light emitting device packages 100, 100a, 100b, and 100c illustrated in FIGS. 1 and 13 through 15. The light emitting structures 110a, 110b, and 110c illustrated in FIGS. 16 through 18 may be disposed in a manner of being rotated by 180 degrees within the semiconductor light emitting device packages 100, 100a, 100b, and 100c. Therefore, the bump pads 115 (see FIG. 1) may be disposed on the connection electrodes 116a, 118a, 116b and 118b in FIGS. 16 and 17 and the first and second electrodes 114c and 118c in FIG. 18.

Referring to FIG. 16, the light emitting structure 110a according to an exemplary embodiment may have a semiconductor structure SSa including a first conductivity-type semiconductor layer 111a, an active layer 112a and a second conductivity-type semiconductor layer 113a. In addition, the light emitting structure 110a may further include first and second contact electrodes 114a and 115a electrically connected to the first and second conductivity-type semiconductor layers 111a and 113a, connection electrodes 116a and 118a connected to the first and second contact electrodes 114a and 115a, and an insulating layer 117a.

The bump pads 115 (see FIG. 1) may be disposed on the connection electrodes 116a and 118a.

The first and second conductivity-type semiconductor layers 111a and 113a may be formed of a semiconductor material doped with n-type and p-type impurities, respectively, but are not limited thereto. On the contrary, the first and second conductivity-type semiconductor layers 111a and 113a may be formed of semiconductor doped with p-type and n-type impurities, respectively. For example, the first and second conductivity-type semiconductor layers 111a and 113a may be formed of nitride semiconductor such as $Al_xIn_yGa_{1-x-y}N$ ($0 \le x \le 1$, $0 \le y \le 1$, and $0 \le x+y \le 1$). Each of the first and second conductivity-type semiconductor layers 111a and 113a may be formed as a single layer or may include a plurality of layers having different properties with respect to doping concentrations, compositions and the like. Alternatively, the first and second conductivity-type semiconductor layers 111a and 113a may be formed of AlInGaP-based or AlInGaAs-based semiconductor. In the present exemplary embodiment, for example, the first conductivity-type semiconductor layer 111a may be formed of n-GaN doped with silicon (Si) or carbon (C), while the second conductivity-type semiconductor layer 113a may be formed of p-GaN doped with magnesium (Mg) or zinc (Zn).

The active layer 112a may be disposed between the first and second conductivity-type semiconductor layers 111a and 113a. The active layer 112a may emit light having a predetermined level of energy through electron-hole recombination. The active layer 112a may be formed of a single material such as InGaN. Alternatively, the active layer 112a may have a single-quantum well (SQW) structure or a multi-quantum well (MQW) structure in which quantum well layers and quantum barrier layers are alternately stacked. For example, in a case of nitride semiconductor, a GaN/InGaN structure may be used. In a case in which the active layer 112a includes InGaN, an increase in the content of indium (In) may alleviate crystalline defects resulting from a lattice mismatch and improve internal quantum efficiency of the semiconductor light emitting device. In addition, wavelengths of light emitted from the active layer 112a may be adjusted according to the content of In within the active layer 112a.

Portions of the connection electrodes 116a and 118a may be connected to portions of the first and second contact electrodes 114a and 115a.

The first and second contact electrodes 114a and 115a and the connection electrodes 116a and 118a may be formed of a conductive material and may have a single layer structure or a multilayer structure. For example, the first and second contact electrodes 114a and 115a and the connection electrodes 116a and 118a may include at least one of gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chrome (Cr), tungsten (W), ruthenium (Ru), rhodium (Rh), iridium (Ir), nickel (Ni), palladium (Pd), platinum (Pt) or alloys thereof.

The insulating layer 117a may be disposed on the second contact electrode 115a to prevent the second contact electrode 115a or the second conductivity-type semiconductor layer 113a from contacting the connection electrode 116a. For example, the insulating layer 117a may be formed of an oxide or a nitride.

Referring to FIG. 17, the light emitting structure 110b according to an exemplary embodiment may have a semiconductor structure SSb including a first conductivity-type semiconductor layer 111b, an active layer 112b and a second conductivity-type semiconductor layer 113b. In addition, the light emitting structure 110b may further include first and second contact electrodes 114b and 115b electrically connected to the first and second conductivity-type semiconductor layers 111b and 113b, connection electrodes 116b and 118b connected to the first and second contact electrodes 114b and 115b, and an insulating layer 117b.

In the present exemplary embodiment, the first contact electrode 114b may be formed to penetrate through the second conductivity-type semiconductor layer 113b and the active layer 112b to thereby be provided as a via electrode electrically connected to the first conductivity-type semiconductor layer 111b. For example, the first contact electrodes 114b may be arranged in a plurality of rows and columns.

The insulating layer 117b may be formed on the circumference of the first contact electrode 114b and the second contact electrode 115b so as to electrically insulate the first contact electrode 114b from the second conductivity-type semiconductor layer 113b and the active layer 112b and to electrically insulate the second contact electrode 115b from the connection electrode 116b.

Referring to FIG. 18, the light emitting structure 110c according to the present exemplary embodiment may have a semiconductor structure SSc which is a core-shell nanostructure including a first conductivity-type semiconductor core 111c, an active layer 112c and a second conductivity-type semiconductor layer 113c. In addition, the light emitting structure 110c may further include a base layer 119c, a mask layer 117c disposed on the base layer 119c, a transparent electrode layer 115c disposed on the second conductivity-type semiconductor layer 113c, a first electrode 114c electrically connected to the base layer 119c, a second electrode 118c electrically connected to the second conductivity-type semiconductor layer 113b, and a filler layer 116c. The number of semiconductor structures SSc is not limited to that illustrated in FIG. 18, and the semiconductor structures SSc may be arranged in the form of a hexagon.

The base layer 119c may be formed of a conductive material. The base layer 119c may be a group III-V compound semiconductor layer. For example, the base layer 119c may be formed of GaN or n-GaN doped with n-type impurities. The base layer 119c may provide a crystal plane for growth of the first conductivity-type semiconductor core 111c, and may be connected to one ends of the semiconductor structures SSc to thereby serve as a contact electrode.

The mask layer 117c may be formed of a silicon oxide or a silicon nitride. In exemplary embodiments, the mask layer 117c may be a distributed Bragg reflector (DBR) layer or an omnidirectional reflector (ODR) layer. The mask layer 117c may have a plurality of openings exposing portions of the base layer 119c. The diameters, lengths, positions and growth conditions of the semiconductor structures SSc may be determined according to sizes of the openings. The semiconductor structures SSc may be positioned to correspond to the plurality of openings.

The transparent electrode layer 115c may be electrically connected to the second conductivity-type semiconductor layer 113c. The transparent electrode layer 115c may cover top and side surfaces of the semiconductor structures SSc, and may be extended between adjacent semiconductor structures SSc. For example, the transparent electrode layer 115c may be formed of an indium tin oxide (ITO), an aluminum zinc oxide (AZO), an indium zinc oxide (IZO), a zinc oxide (ZnO), GZO(ZnO:Ga), an indium oxide ($In_2O_3$), a tin oxide ($SnO_2$), a cadmium oxide (CdO), a cadmium tin oxide ($CdSnO_4$), or a gallium oxide ($Ga_2O_3$).

The filler layer 116c may be disposed on the transparent electrode layer 115c while covering lower portions of the semiconductor structures SSc. The filler layer 116c may fill spaces between adjacent semiconductor structures SSc. The filler layer 116c may be formed of a light-transmissive insulating material. For example, the filler layer 116c may include a silicon oxide ($SiO_2$), a silicon nitride ($SiN_x$), an aluminum oxide ($Al_2O_3$), a hafnium oxide (HfO), a titanium oxide ($TiO_2$), or a zirconium oxide (ZrO). Alternatively, in exemplary embodiments, the filler layer 116c may include a conductive material. In this case, the filler layer 116c may be formed to be electrically connected to the second electrode 118c or may be integrally formed with the second electrode 118c.

The first and second electrodes 114c and 118c may be disposed to be electrically connected to the base layer 119c and the second conductivity-type semiconductor layer 113c, respectively. However, the arrangement and shapes of the first and second electrodes 114c and 118c may be varied according to exemplary embodiments. The first and second electrodes 114c and 118c may be formed of a conductive material and may have a single layer structure or a multi-layer structure. The first and second electrodes 114c and 118c may be a reflective metal layer in consideration of light extraction efficiency.

Figure 19:
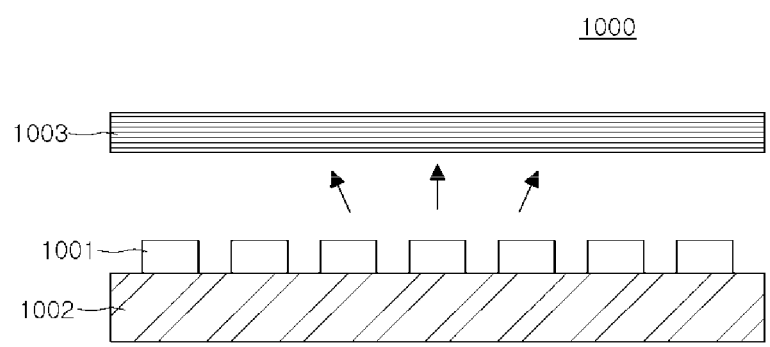
FIGS. 19 and 20 illustrate examples of a backlight unit including a semiconductor light emitting device package according to an exemplary embodiment.
Figure 20:
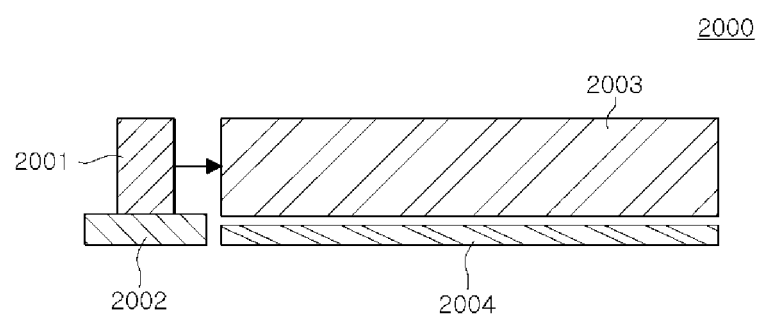

FIGS. 19 and 20 illustrate examples of a backlight unit including a semiconductor light emitting device package according to an exemplary embodiment.

Referring to FIG. 19, a backlight unit 1000 may include at least one light source 1001 mounted on a substrate 1002 and at least one optical sheet 1003 disposed thereabove. The light source 1001 may be the semiconductor light emitting device package 100, 100a, 100b, or 100c, discussed with reference to FIGS. 1 and 13 through 15. The backlight unit 1000 may have a so-called flip chip on module (FCOM) structure in which the semiconductor light emitting device package is directly mounted on the substrate 1002.

The light source 1001 in the backlight unit 1000 of FIG. 19 emits light toward a liquid crystal display (LCD) device disposed thereabove, whereas a light source 2001 mounted on a substrate 2002 in a backlight unit 2000 according to another exemplary embodiment illustrated in FIG. 20 emits light laterally and the light is incident to a light guide plate 2003 such that the backlight unit 2000 is able to serve as a surface light source. The light passing through the light guide plate 2003 may be emitted upwardly and a reflective layer 2004 may be disposed below a bottom surface of the light guide plate 2003 in order to improve light extraction efficiency.

Figure 21:
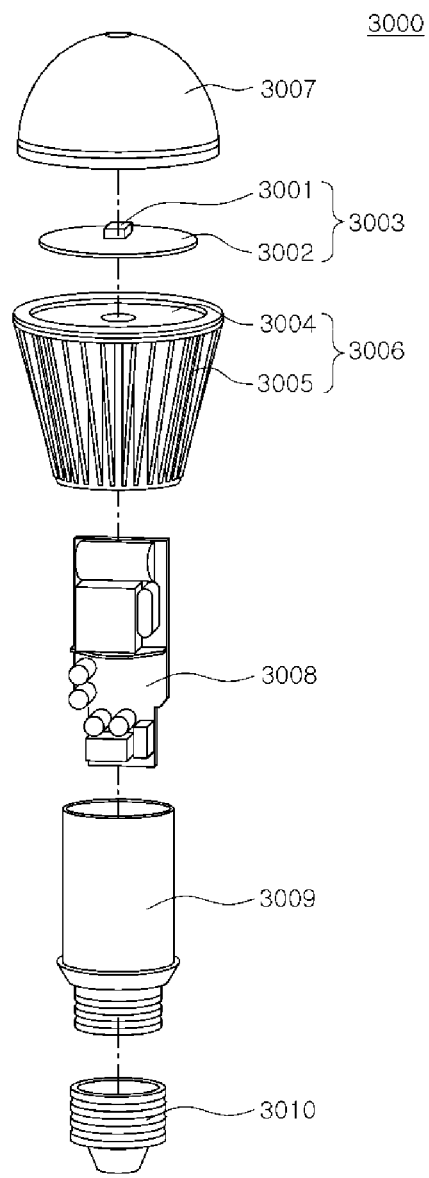
FIG. 21 illustrates an example of a lighting device including a semiconductor light emitting device package according to an exemplary embodiment.

FIG. 21 illustrates an example of a lighting device including a semiconductor light emitting device package according to an exemplary embodiment.

Referring to an exploded perspective view of FIG. 21, a lighting device 3000 is exemplified as a bulb-type lamp, and may include a light emitting module 3003, a driver 3008 and an external connector 3010. In addition, the lighting device 3000 may further include exterior structures, such as external and internal housings 3006 and 3009 and a cover 3007. The light emitting module 3003 may include a light source 3001 having the same structure as that of the semiconductor light emitting device package 100, 100a, 100b, or 100c, discussed with reference to FIGS. 1 and 13 through 15, or a structure similar thereto, and a circuit board 3002 on which the light source 3001 is mounted. In the present exemplary embodiment, a single light source 3001 is mounted on the circuit board 3002 by way of example. However, a plurality of light sources may be mounted thereon in accordance with circumstances.

The external housing 3006 may serve as a heat dissipation part and may include a heat sink plate 3004 directly contacting the light emitting module 3003 to thereby improve heat dissipation and heat dissipation fins 3005 surrounding the heat sink plate 3004 and a side surface of the lighting device 3000. The cover 3007 may be disposed above the light emitting module 3003 and have a convex lens shape. The driver 3008 may be disposed inside the internal housing 3009 and be connected to the external connector 3010 such as a socket structure to receive power from an external power source. In addition, the driver 3008 may convert the received power into power appropriate for driving the light source 3001 of the light emitting module 3003 and supply the converted power thereto. For example, the driver 3008 may be provided as an AC-DC converter, a rectifying circuit part, or the like.

In addition, the lighting device 3000 may further include a communications module.

Figure 22:
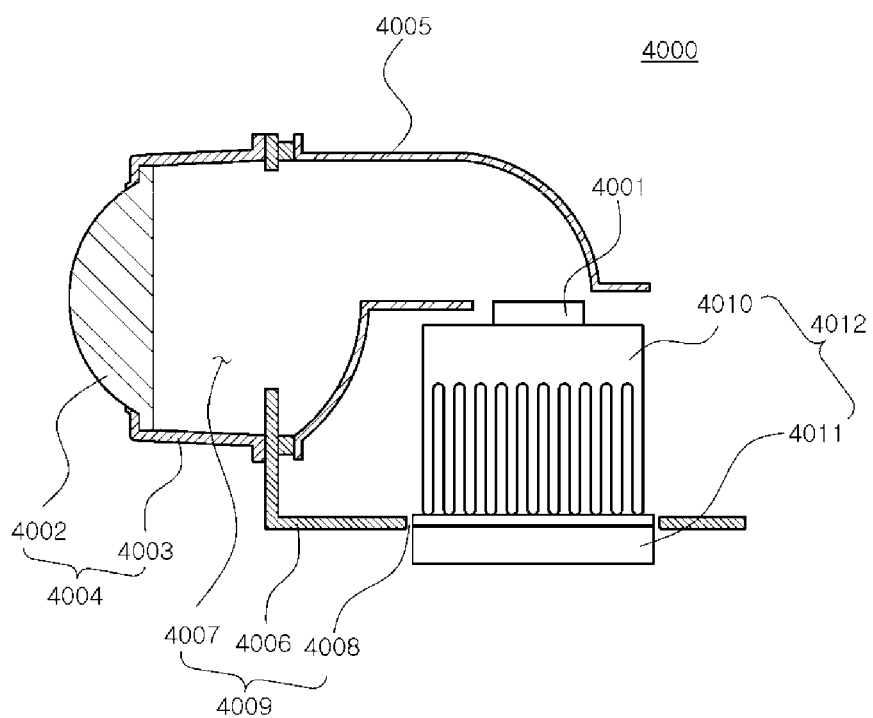
FIG. 22 illustrates an example of a headlamp including a semiconductor light emitting device package according to an exemplary embodiment.

FIG. 22 illustrates an example of a headlamp including a semiconductor light emitting device package according to an exemplary embodiment.

Referring to FIG. 22, a headlamp 4000 used in a vehicle or the like may include a light source 4001, a reflector 4005 and a lens cover 4004, and the lens cover 4004 may include a hollow guide part 4003 and a lens 4002. The light source 4001 may include at least one of the semiconductor light emitting device packages 100, 100a, 100b, and 100c, discussed with reference to FIGS. 1 and 13 through 15. The headlamp 4000 may further include a heat dissipation part 4012 externally dissipating heat generated by the light source 4001. The heat dissipation part 4012 may include a heat sink 4010 and a cooling fan 4011 in order to effectively dissipate heat. In addition, the headlamp 4000 may further include a housing 4009 allowing the heat dissipation part 4012 and the reflector 4005 to be fixed thereto and supported thereby. The housing 4009 may include a body 4006 and a central hole 4008 formed in one surface of the housing 4009, to which the heat dissipation part 4012 is coupled. In addition, the housing 4009 may include a forwardly open hole 4007 formed in the other surface thereof integrally connected to one surface thereof and bent in a direction perpendicular thereto. The reflector 4005 may be fixed to the housing 4009, such that light generated by the light source 4001 may be reflected by the reflector 4005, pass through the forwardly open hole 4007, and be emitted outwards.

Figure 23:
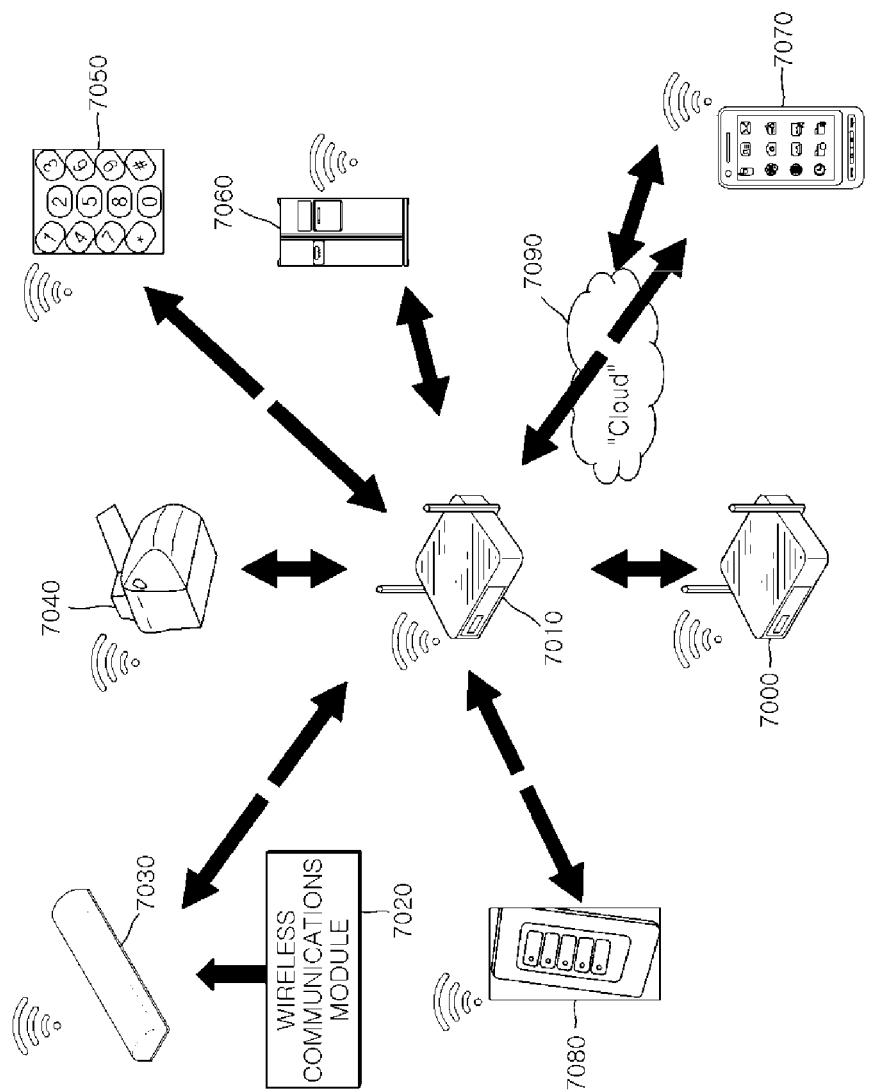
FIG. 23 illustrates an example of a home network to which a lighting system including a semiconductor light emitting device package according to an exemplary embodiment is applied.

FIG. 23 illustrates an example of a home network to which a lighting system including a semiconductor light emitting device package, according to an exemplary embodiment, is applied.

Referring to FIG. 23, a home network may include a home wireless router 7000, a gateway hub 7010, a wireless communications module 7020, a lighting device 7030, a garage door lock 7040, a wireless door lock 7050, a home application 7060, a cellular phone 7070, a general light switch 7080, and a cloud network 7090.

For example, the wireless communications module 7020 may be a ZigBee™ module. In order to enable wireless communications in the home, a signal from the lighting device 7030 may be transmitted to home appliances, such as the garage door lock 7040, the wireless door lock 7050, the home application 7060, the cellular phone 7070 and the light switch 7080, through the gateway hub 7010 to thereby control the home appliances. In addition, the lighting device 7030 may be controlled by the signal from the home appliances. Therefore, the home appliances may also include a wireless communication module for enabling wireless communications such as ZigBee™ and/or Wi-Fi. In exemplary embodiments, the lighting device 7030 may directly communicate with the home appliances, without the gateway hub 7010.

By using such wireless communications in the home, the brightness of the lighting device 7030 may be automatically controlled, according to the operational states of the home appliances and/or surrounding environments/circumstances in a bedroom, a living room, entrance, a garage, and the like.

For example, the brightness of the lighting device 7030 may be automatically adjusted using the gateway hub 7010 and the wireless communications module 7020 according to the types of program playing on a TV or the brightness of a screen. For example, in a case in which a drama is being aired and a cozy atmosphere is required, a color tone may be adjusted such that a color temperature of illumination is decreased to 5000 K or below. In another example, in a case in which a light atmosphere is required for the viewing of a program such as a comedy program, a color temperature of illumination is increased to 5000 K or higher and illumination is adjusted to be blue-based white light. Alternatively, the brightness of the lighting device 7030 may be controlled through the cellular phone 7070 using the gateway hub 7010 and the wireless communications module 7020.

The wireless communications module 7020 may be modularized with an optical sensor, and may also be configured to be integrated with the lighting device 7030.

As set forth above, according to exemplary embodiments, there are provided a semiconductor light emitting device package employing a structure able to control light laterally emitted through side surfaces thereof using a reflective layer, and a method for manufacturing the same, which can reduce manufacturing costs while securing improved light emitting performance and reliability.

While exemplary embodiments have been shown and described above, it will be apparent to those skilled in the art that modifications and variations could be made without departing from the scope of the inventive concept as defined by the appended claims.

What is claimed:

1. A method for manufacturing a semiconductor light emitting device package, the method comprising:
    forming a light emitting structure on a growth substrate;
    forming a reflective layer on a first surface of the light emitting structure;
    forming bumps on the first surface of the light emitting structure, the bumps being electrically connected to the light emitting structure and protruding from the reflective layer;
    bonding a support substrate to the bumps on the first surface of the light emitting structure;
    removing the growth substrate;
    bonding a light transmissive substrate coated with a wavelength conversion layer to a second surface of the light emitting structure from which the growth substrate is removed; and
    removing the support substrate,
    wherein the reflective layer covers at least a portion of side surfaces of the light emitting structure and at least a portion of side surfaces of the bumps.

2. The method of claim 1, wherein the side surfaces of the light emitting structure are covered by the reflective layer and the wavelength conversion layer.

3. The method of claim 1, wherein at least one of the side surfaces of the light emitting structure includes at least two inclined surfaces having different inclinations.

4. The method of claim 3, wherein a boundary between the two inclined surfaces corresponds to a boundary between the reflective layer and the wavelength conversion layer.

5. The method of claim 1, wherein the light emitting structure includes a first conductivity-type semiconductor layer, and
    wherein the wavelength conversion layer is formed on a surface of the light transmissive substrate facing the first conductivity-type semiconductor layer.

6. The method of claim 1, wherein the forming of the reflective layer includes:

forming a mask layer, covering regions in which the bumps are to be formed and isolation regions in which the light emitting structure is cut into package units, on the first surface of the light emitting structure;

forming a material layer for forming the reflective layer to cover portions of the light emitting structure exposed through the mask layer;

removing a portion of the material layer for forming the reflective layer using a planarization method to expose a top surface of the mask layer; and removing the mask layer.

7. The method of claim 1, wherein the bumps protrude from a top surface of the reflective layer.

8. The method of claim 1, further comprising, prior to forming the reflective layer:

mesa-etching the light emitting structure to expose a portion of a first conductivity-type semiconductor layer of the light emitting structure; and forming electrodes and bump pads on the first surface of the light emitting structure.

9. The method of claim 1, wherein the support substrate is bonded to the bumps on the first surface of the light emitting structure using an adhesive layer.

10. The method of claim 1, further comprising forming uneven portions on the second surface of the light emitting structure after removing the growth substrate.

11. The method of claim 1, further comprising removing a portion of the light emitting structure and dividing the light emitting structure into package units, after removing the growth substrate.

12. The method of claim 1, further comprising cutting the light transmissive substrate and the wavelength conversion layer into package units, after removing the support substrate.

13. The method of claim 1, wherein a plurality of semiconductor light emitting device packages are manufactured on a wafer level, and the wavelength conversion layer is bonded to the light emitting structure on the wafer level.

14. The method of claim 13, wherein the wavelength conversion layer has a thickness variation of 1 μm to 3 μm among the plurality of packages manufactured on the wafer level.

15. A method for manufacturing a semiconductor light emitting device package, the method comprising:

forming a light emitting structure on a growth substrate;

forming a reflective layer on a first surface of the light emitting structure;

forming bumps on the first surface of the light emitting structure, the bumps being electrically connected to the light emitting structure, surrounded by the reflective layer and protruding from the reflective layer;

bonding a support substrate to the bumps on the first surface of the light emitting structure;

removing the growth substrate;

removing a portion of the light emitting structure and dividing the light emitting structure into package units;

bonding a light transmissive substrate coated with a wavelength conversion layer to a second surface of the light emitting structure from which the growth substrate is removed; and removing the support substrate, wherein side surfaces of the light emitting structure are covered by the reflective layer and the wavelength conversion layer.

16. The method of claim 15, further comprising mesa-etching the light emitting structure to expose a portion of a first conductivity-type semiconductor layer of the light emitting structure prior to forming the reflective layer, wherein the mesa-etching of the light emitting structure creates a first side surface of the light emitting structure.

17. The method of claim 16, wherein the dividing of the light emitting structure creates a second side surface of the light emitting structure, and the first and second side surfaces have different inclinations.

18. The method of claim 17, wherein the wavelength conversion layer covers the second side surface of the light emitting structure.

19. The method of claim 16, wherein the reflective layer covers the first side surface of the light emitting structure.

20. The method of claim 15, wherein the reflective layer contacts the wavelength conversion layer on at least one of the side surfaces of the light emitting structure.

* * * * *